United States Patent
Joshi et al.

(10) Patent No.: US 9,418,959 B1
(45) Date of Patent: Aug. 16, 2016

(54) SYSTEMS OF BONDED SUBSTRATES

(71) Applicant: Toyota Motor Engineering & Manufacturing North America, Inc., Erlanger, KY (US)

(72) Inventors: Shailesh N. Joshi, Ann Arbor, MI (US); Masao Noguchi, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 14/794,286

(22) Filed: Jul. 8, 2015

(51) Int. Cl.
| | |
|---|---|
| H01L 23/00 | (2006.01) |
| B23K 31/02 | (2006.01) |
| C09J 9/02 | (2006.01) |
| H01L 23/367 | (2006.01) |
| B23K 1/20 | (2006.01) |
| C09J 7/02 | (2006.01) |

(52) U.S. Cl.
CPC . *H01L 24/32* (2013.01); *B23K 1/20* (2013.01); *B23K 31/02* (2013.01); *C09J 9/02* (2013.01); *H01L 23/3675* (2013.01); *C09J 7/0228* (2013.01); *H01L 2224/2939* (2013.01); *H01L 2224/29211* (2013.01); *H01L 2224/29224* (2013.01); *H01L 2224/29239* (2013.01); *H01L 2224/29247* (2013.01); *H01L 2224/29255* (2013.01); *H01L 2224/29499* (2013.01); *H01L 2224/32245* (2013.01)

(58) Field of Classification Search
CPC ............. B23K 1/20; B23K 31/02; C09J 9/02; C09J 7/0228; H01L 24/32; H01L 2224/29255; H01L 2224/2939; H01L 2224/29499; H01L 2224/29211; H01L 23/3675

USPC .............. 257/690, 691, 692, 712, 723, 734, 257/E21.51, E21.514, E21.517, E23.023, 257/E23.116; 428/40.2, 40.9; 174/257; 228/176, 206, 208; 361/719, 720; 438/109, 125; 451/490

See application file for complete search history.

(56) References Cited

U.S. PATENT DOCUMENTS

| | | | |
|---|---|---|---|
| 3,057,445 A | 10/1962 | Bronnes | |
| 5,812,925 A * | 9/1998 | Ecer | B22F 7/064 228/194 |
| 6,171,710 B1 | 1/2001 | Ogino et al. | |
| 6,486,542 B1 | 11/2002 | Ohashi et al. | |
| 8,211,529 B2 | 7/2012 | Schaefer | |
| 8,814,029 B2 * | 8/2014 | Yanase et al. | B23K 20/023 228/206 |
| 2009/0278252 A1 * | 11/2009 | Oikawa | H01L 23/293 257/702 |
| 2011/0073236 A1 | 3/2011 | Lee | |

(Continued)

FOREIGN PATENT DOCUMENTS

JP 2010050189 3/2010

*Primary Examiner* — Dao H Nguyen
(74) *Attorney, Agent, or Firm* — Dinsmore & Shohl LLP

(57) ABSTRACT

A system of bonded substrates may include a first substrate, a second substrate, and a composite bonding layer. The first substrate may include a bonding surface and the second substrate may include a complementary bonding surface. The composite bonding layer may be positioned between the first substrate and the second substrate. The composite boding layer may include a metal matrix and a plurality of stress-reducing additives disposed in the metal matrix. Each stress-reducing additive may include a three-dimensional shape The stress-reducing additives may include a ratio of length:height of at least about 2:1. An elastic modulus of a material of the stress-reducing additive may be less than an elastic modulus of the material of the metal matrix.

20 Claims, 3 Drawing Sheets

(56) References Cited

U.S. PATENT DOCUMENTS

| | | | | |
|---|---|---|---|---|
| 2012/0295052 A1* | 11/2012 | Choi | ................... | B32B 5/022 428/40.9 |
| 2013/0196581 A1* | 8/2013 | Boutaghou | ............. | B24D 3/00 451/490 |
| 2013/0206821 A1* | 8/2013 | Saito | ................... | B23K 20/02 228/208 |
| 2013/0270327 A1* | 10/2013 | Yoon | ................... | B23K 31/02 228/176 |
| 2014/0069698 A1* | 3/2014 | Choi | ................... | C09J 9/02 174/257 |
| 2015/0014022 A1* | 1/2015 | Young | ................ | H01L 31/0481 174/251 |
| 2015/0322298 A1* | 11/2015 | Kristiansen | ................ | C09J 9/02 428/40.2 |

* cited by examiner

SYSTEMS OF BONDED SUBSTRATES

TECHNICAL FIELD

The present specification generally relates to the bonding of substrates and, more specifically, to the bonding of substrates with metallic bonding layers.

BACKGROUND

Components of electrical devices which operate at elevated temperatures may need to be bonded with one another. For example, power semiconductor devices, such as those fabricated from silicon carbide, may be designed to operate at very high operating temperatures (e.g., greater than 250° C.). Such power semiconductor devices may be bonded to a cooling device, such as heat sink or a liquid cooling assembly. The cooling device removes heat from the power semiconductor to ensure that it operates at a temperature that is below its maximum operating temperature. The bonding layer that bonds the power semiconductor device to the cooling device must be able to withstand the high operating temperatures and have relatively high thermal conductivity.

However, many materials exhibiting relatively high thermal conductivity, such as metals, are relatively brittle. Stresses on the substrates may cause fracturing of the bond layer, and failure of the bonded system may result. Accordingly, a need exists for alternative methods for bonding two substrates to one another.

SUMMARY

In one embodiment, a system of bonded substrates may comprise a first substrate, a second substrate, and a composite bonding layer. The first substrate may comprise a bonding surface and the second substrate may comprise a complementary bonding surface. The composite bonding layer may be positioned between the first substrate and the second substrate and may be in contact with the bonding surface of the first substrate and the complementary bonding surface of the second substrate. The composite boding layer may comprise a metal matrix and a plurality of stress-reducing additives disposed in the metal matrix. Each stress-reducing additive may comprise a three-dimensional shape that may comprise a height in a direction substantially perpendicular to the bonding surface of the first substrate, a length in a direction substantially parallel to the bonding surface of the first substrate, and a width in a direction substantially parallel to the bonding surface of the first substrate. The stress-reducing additives may comprise a ratio of length:height of at least about 2:1. An elastic modulus of a material of the stress-reducing additive may be less than an elastic modulus of the material of the metal matrix.

In another embodiment, a system of bonded substrates may comprise a first substrate, a second substrate, and a composite bonding layer. The first substrate may comprise a bonding surface and the second substrate may comprise a complementary bonding surface. The composite bonding layer may be positioned between the first substrate and the second substrate and may be in contact with the bonding surface of the first substrate and the complementary bonding surface of the second substrate. The composite boding layer may comprise a metal matrix and a plurality of stress-reducing additives disposed in the metal matrix. Each stress-reducing additive may comprise a three-dimensional shape that may comprise a height in a direction substantially perpendicular to the bonding surface of the first substrate, a length in a direction substantially parallel to the bonding surface of the first substrate, and a width in a direction substantially parallel to the bonding surface of the first substrate. The stress-reducing additives may comprise a ratio of height:length of at least about 5:1 and a ratio of height:width of at least about 5:1. An elastic modulus of a material of the stress-reducing additive may be less than an elastic modulus of the material of the metal matrix.

In yet another embodiment, a composite bonding layer may be positioned between a first substrate and a second substrate. The composite boding layer may comprise a metal matrix and a plurality of stress-reducing additives disposed in the metal matrix. Each stress-reducing additive may comprise a three-dimensional shape that may comprise a height in a direction substantially perpendicular to the bonding surface of the first substrate, a length in a direction substantially parallel to the bonding surface of the first substrate, and a width in a direction substantially parallel to the bonding surface of the first substrate. The stress-reducing additives may comprise a ratio of length:height of at least about 2:1. An elastic modulus of a material of the stress-reducing additive may be less than an elastic modulus of the material of the metal matrix.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to methods for bonding two or more substrates together, and to bonding systems generally comprising two or more substrates bonded to one another. Generally, the substrates may be bonded together with a composite bonding layer, where the composite bonding layer comprises a plurality of stress-reducing additives in a metal matrix. The stress reducing additives are generally dispersed through the metal matrix and may comprise a material that has an elastic modulus that is less than the elastic modulus of the material of the metal matrix. In such embodiments, stresses in the bonding layer, sometimes caused by forces applied to the substrates, may be reduced, and bonding layer durability and strength may be improved. Additionally, stresses introduced into the composite bonding layer by high operation temperatures and thermal cycling may be reduced. Various embodiments of bonded systems are described in detail herein.

Figure 1:
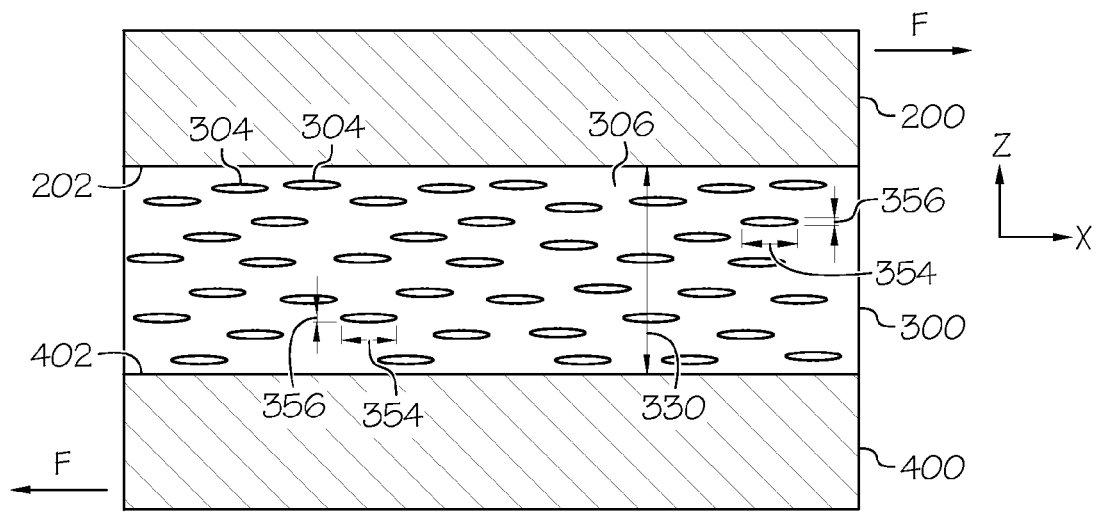
FIG. 1 schematically depicts a cross-sectional side view of two substrates bonded to one another with a bonding layer, according to one or more embodiments shown and described herein.

FIG. 1 generally depicts a system of bonded substrates 100 comprising an upper substrate 200 and a lower substrate 400 bonded to one another with a composite bonding layer 300. The composite bonding layer 300 is positioned generally between the upper substrate 200 and the lower substrate 400 and directly contacting the upper substrate 200 at the upper substrate bonding surface 202 and the lower substrate 400 at the complementary lower substrate bonding surface 402. In one embodiment, the lower substrate bonding surface 402 and/or the upper substrate bonding surface 202 may be substantially planar and substantially parallel relative to one another.

While one substrate is referred to herein as the "upper substrate" and the other substrate is referred to herein as the "lower substrate," the two substrates 200, 400 need not necessarily be arranged above and below one another, and the nomenclature of "upper" and "lower" is merely representative of the relative positioning in the upper substrate 200 and lower substrate 400 as depicted in the drawings described herein. Additionally, it should be understood herein that any feature of the upper substrate 200 may be included in the lower substrate 400, and vice versa. Generally, the lower substrate 400 and the upper substrate 200 each comprise bonding surfaces, referred to as the lower substrate bonding surface 402 and upper substrate bonding surface 202, respectively. The lower substrate bonding surface 402 and upper substrate bonding surface 202 may be referred to as "complementary" herein, meaning that the two bonding surfaces generally have geometries making them suitable for bonding with one another, such as with a bonding layer 300 as described in embodiments herein.

The lower substrate 400 may comprise a wide variety of materials, including, but not limited to, one or more metals such as, but not limited to, copper, aluminum, nickel, or combinations thereof. In embodiments, the lower substrate 400 may comprise at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, at least about 99.5 wt % aluminum, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, and/or at least about 99.5 wt % nickel. For example, the lower substrate 400 may comprise a heat sink for a power electronic device. It is contemplated herein that the composition of the lower substrate 400 at the lower substrate bonding surface 402 may be any of the material compositions disclosed herein.

In other embodiments, the lower substrate 400 may comprise non-metals such as, but not limited to, metal oxides, metal nitrides, metal carbides, or combinations thereof, including, but not limited to, alumina, beryllium oxide, aluminum nitride, silicon carbide, or combinations thereof. For example, the lower substrate 400 may comprise a die for a power electronic device. In embodiments, the lower substrate 400 may comprise at least about 50 wt % metal oxides, at least about 60 wt % metal oxides, at least about 70 wt % metal oxides, at least about 80 wt % metal oxides, at least about 90 wt % metal oxides, at least about 95 wt % metal oxides, at least about 99 wt % metal oxides, at least about 99.5 wt % metal oxides, at least about 50 wt % metal nitrides, at least about 60 wt % metal nitrides, at least about 70 wt % metal nitrides, at least about 80 wt % metal nitrides, at least about 90 wt % metal nitrides, at least about 95 wt % metal nitrides, at least about 99 wt % metal nitrides, at least about 99.5 wt % metal nitrides, at least about 50 wt % metal carbides, at least about 60 wt % metal carbides, at least about 70 wt % metal carbides, at least about 80 wt % metal carbides, at least about 90 wt % metal carbides, at least about 95 wt % metal carbides, at least about 99 wt % metal carbides, and/or at least about 99.5 wt % metal carbides. It is contemplated herein that the composition of the lower substrate 400 at the lower substrate bonding surface 402 may be any of the material compositions disclosed herein.

In one embodiment, the lower substrate 400 may comprise a direct bonded metal, such as, but not limited to, direct bonded copper (DBC) or direct bonded aluminum (DBA). For example, direct bonded metallic layer may be bonded to a bulk material by a high-temperature oxidation process where copper and the bulk material are heated to a controlled temperature in an atmosphere of nitrogen containing about 30 ppm of oxygen to form a copper-oxygen eutectic. In another embodiment, the lower substrate 400 may comprise a material that is metal plated on the lower substrate bonding surface 402, such as a nickel plated lower substrate bonding surface 402.

The upper substrate 200 may comprise a wide variety of materials, including, but not limited to, one or more metals such as, but not limited to, copper, aluminum, nickel, or combinations thereof. In embodiments, the upper substrate 200 may comprise at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, at least about 99.5 wt % aluminum, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, and/or at least about 99.5 wt % nickel. For example, the upper substrate 200 may comprise a heat sink for a power electronic device. It is contemplated herein that the composition of the upper substrate 200 at the upper substrate bonding surface 202 may be any of the material compositions disclosed herein.

In other embodiments, the upper substrate 200 may comprise non-metals such as, but not limited to, metal oxides, metal nitrides, metal carbides, or combinations thereof, including, but not limited to, alumina, beryllium oxide, aluminum nitride, silicon carbide, or combinations thereof. For example, the upper substrate 200 may comprise a die for a power electronic device. In embodiments, the upper substrate 200 may comprise at least about 50 wt % metal oxides, at least about 60 wt % metal oxides, at least about 70 wt % metal oxides, at least about 80 wt % metal oxides, at least about 90 wt % metal oxides, at least about 95 wt % metal oxides, at least about 99 wt % metal oxides, at least about 99.5 wt % metal oxides, at least about 50 wt % metal nitrides, at least about 60 wt % metal nitrides, at least about 70 wt % metal nitrides, at least about 80 wt % metal nitrides, at least about 90 wt % metal nitrides, at least about 95 wt % metal nitrides, at least about 99 wt % metal nitrides, at least about 99.5 wt % metal nitrides, at least about 50 wt % metal carbides, at least about 60 wt % metal carbides, at least about 70 wt % metal carbides, at least about 80 wt % metal carbides, at least about 90 wt % metal carbides, at least about 95 wt % metal carbides, at least about 99 wt % metal carbides, and/or at least about 99.5 wt % metal carbides. It is contemplated herein that the composition of the upper substrate 200 at the upper substrate bonding surface 202 may be any of the material compositions disclosed herein.

In one embodiment, the upper substrate 200 may comprise a direct bonded metal, such as, but not limited to, direct bonded copper (DBC) or direct bonded aluminum (DBA). For example, direct bonded metallic layer may be bonded to a bulk material by a high-temperature oxidation process where copper and the bulk material are heated to a controlled temperature in an atmosphere of nitrogen containing about 30 ppm of oxygen to form a copper-oxygen eutectic. In another embodiment, the upper substrate 200 may comprise a material that is metal plated on the upper substrate bonding surface 202, such as a nickel plated upper substrate bonding surface 202.

The composite bonding layer 300 may generally comprise a metal matrix 306 and one or more stress-reducing additives 304. As used herein, stress-reducing additives 304 may include any additive which may reduce the stress in the composite bonding layer 300 when a force or stress is applied to the bonding layer 300 directly, or to the attached substrates 200, 400. For example, the composite bonding layer 300 may be stressed when the substrates 200, 400 are exposed to a shear force or a tensile force. Generally, the stress-reducing additives 304 are embedded in the metal matrix 306, where the stress-reducing additives may be partially or fully surrounded by metal matrix 306. In one embodiment, the metal matrix 306 may comprise at least about 50 wt %, at least about 60 wt %, at least about 70 wt %, at least about 80 wt %, at least about 90 wt %, or even at least about 95 wt % of the composite bonding layer 300. The stress-reducing additives may comprise less than or equal to about 50 wt %, less than or equal to about 40 wt %, less than or equal to about 30 wt %, less than or equal to about 20 wt %, less than or equal to about 15 wt %, less than or equal to about 10 wt %, less than or equal to about 5 wt %, less than or equal to about 3 wt %, or even less than or equal to about 1 wt % of the composite bonding layer 300.

The resulting bonded substrates 200, 400 are spaced by a thickness 330 of the composite bonding layer 300, which is the distance between the upper substrate bonding surface 202 and the lower substrate bonding surface 402. In embodiments, the thickness 330 of the composite bonding layer 300 may be from about 5 microns to about 5000 microns, from about 50 microns to about 1000 microns, or from about 100 microns to about 500 microns. For example, the thickness 330 of the composite bonding layer 300 may be at least about 5 microns, at least about 25 microns, at least about 50 microns, at least about 100 microns, at least about 200 microns, at least about 500 microns, less than or equal to about 10000 microns, less than or equal to about 5000 microns, less than or equal to about 1000 microns, less than or equal to about 500 microns, less than or equal to about 250 microns, less than or equal to about 100 microns, or combinations thereof.

In embodiments, the metal matrix 306 may consist of or consist essentially of one or more metals. The metal matrix 306 may comprise a wide variety of metals such as, but not limited to, tin, nickel, copper, silver, aluminum, or combinations thereof. In embodiments, the metal matrix 306 may comprise at least about 50 wt % tin, at least about 60 wt % tin, at least about 70 wt % tin, at least about 80 wt % tin, at least about 90 wt % tin, at least about 95 wt % tin, at least about 99 wt % tin, at least about 99.5 wt % tin, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, at least about 99.5 wt % nickel, at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % silver, at least about 60 wt % silver, at least about 70 wt % silver, at least about 80 wt % silver, at least about 90 wt % silver, at least about 95 wt % silver, at least about 99 wt % silver, at least about 99.5 wt % silver, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, and/or at least about 99.5 wt % aluminum. In other embodiments, the metal matrix 306 may comprise or consist of a mixture of two, three, four, or even more metals.

The stress-reducing additives 304 may comprise a wide variety of materials, including, but not limited to, metals, non-metals, ceramics, polymers, and combinations thereof. In one embodiment, the stress-reducing additives 304 may comprise polymers such as, but not limited to, fluoropolymers, phenolic resins, polyanhydrides, polyesters, polyolefins, rubbers, silicones, silicone rubbers, synthetic rubbers, vinyl polymers, or combinations thereof. For example, the stress-reducing additives 304 may comprise polyethylene, polypropylene, polyaryletherketone, fluoro ethylene propylene, PEEK (Poly(ether ether ketone)), polyphenylene sulfon, polyamide, polyamide imide, polyimide, and the combinations and copolymers thereof. The stress-reducing additives 304 may comprise elastomeric polymers, thermoset polymers, thermoplastic polymers, or combinations thereof. In embodiments, the stress-reducing additives 304 may comprise at least about 50 wt % of one or more polymers, at least about 60 wt % of one or more polymers, at least about 70 wt % of one or more polymers, at least about 80 wt % of one or more polymers, at least about 90 wt % of one or more polymers, at least about 95 wt % of one or more polymers, at least about 99 wt % of one or more polymers, or even at least about 99.5 wt % of one or more polymers.

In embodiments, the stress-reducing additives 304 may consist of or consist essentially of one or more metals. The stress-reducing additives 304 may comprise a wide variety of metals such as, but not limited to, tin, nickel, copper, silver, aluminum, or combinations thereof. In embodiments, the stress-reducing additives 304 may comprise at least about 50 wt % tin, at least about 60 wt % tin, at least about 70 wt % tin, at least about 80 wt % tin, at least about 90 wt % tin, at least about 95 wt % tin, at least about 99 wt % tin, at least about 99.5 wt % tin, at least about 50 wt % nickel, at least about 60 wt % nickel, at least about 70 wt % nickel, at least about 80 wt % nickel, at least about 90 wt % nickel, at least about 95 wt % nickel, at least about 99 wt % nickel, at least about 99.5 wt % nickel, at least about 50 wt % copper, at least about 60 wt % copper, at least about 70 wt % copper, at least about 80 wt % copper, at least about 90 wt % copper, at least about 95 wt % copper, at least about 99 wt % copper, at least about 99.5 wt % copper, at least about 50 wt % silver, at least about 60 wt % silver, at least about 70 wt % silver, at least about 80 wt % silver, at least about 90 wt % silver, at least about 95 wt % silver, at least about 99 wt % silver, at least about 99.5 wt % silver, at least about 50 wt % aluminum, at least about 60 wt % aluminum, at least about 70 wt % aluminum, at least about 80 wt % aluminum, at least about 90 wt % aluminum, at least about 95 wt % aluminum, at least about 99 wt % aluminum, and/or at least about 99.5 wt % aluminum. In other embodiments, the stress-reducing additives 304 may comprise or consist of a mixture of two, three, four, or even more metals.

Generally, the one or more materials of the stress-reducing additives 304 may have a higher elastic modulus than the material of the metal matrix 306. The "elastic modulus" of a material, sometimes referred to as the Young's modulus, is a measure of the stiffness of an elastic material and is a quantity used to characterize materials. It is defined as the ratio of the stress (force per unit area) along an axis to the strain (ratio of deformation over initial length) along that axis in the range of stress in which Hooke's law holds. As used herein, the elastic modulus of the material of the metal matrix 306 or the elastic modulus of the material of the stress-reducing additives 304 refers to the elastic modulus of the mixture of chemical species present in the particular material.

In embodiments, the material of the stress-reducing additives 304 may have an elastic modulus of less than or equal to about 50 GPa, less than or equal to about 40 GPa, less than or equal to about 30 GPa, less than or equal to about 20 GPa, less than or equal to about 10 GPa, less than or equal to about 5 GPa, or even less than or equal to about 1 GPa. In embodiments, the material of the metal matrix 306 may have an elastic modulus of at least about 5 GPa, at least about 10 GPa, at least about 20 GPa, at least about 30 GPa, at least about 40 GPa, at least about 50 GPa, at least about 75 GPa, or even at least about 100 GPa. The difference in the elastic modulus of the material of the metal matrix 306 and the stress-reducing additives 304 may be at least about 1 MPa, at least about 3 MPa, at least about 5 MPa, at least about 10 MPa, at least about 15 MPa, at least about 20 MPa, at least about 30 MPa, at least about 40 MPa, or even at least about 50 MPa. In embodiments, the elastic modulus of the material of the metal matrix 306 may be at least about 5% greater, at least about 10% greater, at least about 20% greater, or at least about 30% greater, at least about 40% greater, at least about 50% greater, at least about 75% greater, at least about 100% greater, at least about 200% greater, at least about 300% greater, or even at least about 500% greater than the elastic modulus of the material of the stress-reducing additives 304.

The stress-reducing additives 304 may generally be structures that are embedded in the metal matrix 306. The stress-reducing additives 304 may comprise a wide variety of shapes, including, but not limited to, a substantially spherical shape, a substantially ellipsoid shape, a substantially disk shape, a substantially rod shape, a substantially oblong shape (i.e., elongated in one dimension), or a substantially rectangular shape.

In embodiments, each stress-reducing additive 304 comprising a three-dimensional shape comprising a height 356, a length 354, and a width 352. As used herein, the height 356 of each stress-reducing additive 304 is in a direction substantially perpendicular to the upper substrate bonding surface 202 and/or the lower substrate bonding surface 402, the length 354 of each stress-reducing additive 304 is in a direction substantially parallel to the upper substrate bonding surface 202 and/or the lower substrate bonding surface 402, and the width 352 of each stress-reducing additive 304 is in a direction substantially parallel to the upper substrate bonding surface 202 and/or the lower substrate bonding surface 402.

In such an arrangement, the height 356, length 354, and width 352 are measured in directions that are orthogonal relative to one other, respectively. For example, the direction of the height 356 is orthogonal to the direction of the length 354 and the direction of the width 352, and is perpendicular to the plane formed by the direction of the length 354 and the direction of the width 352. As used herein, the length 354 of a stress-reducing additive 304 is defined as the greatest distance from one end to the other end of a stress-reducing additive 304. Therefore, as defined herein, the length 354 of a stress-reducing additive 304 is greater than or equal to the width 352 of the stress-reducing additive 304. It should be understood that, as the longest distance on a plane substantially parallel to the upper substrate bonding surface 202 and/or the lower substrate bonding surface 402, the length 354 of each stress-reducing additive 304 may not be in the same direction (but will be in a direction on a plane substantially parallel to the upper substrate bonding surface 202 and/or the lower substrate bonding surface 402).

Figure 2:
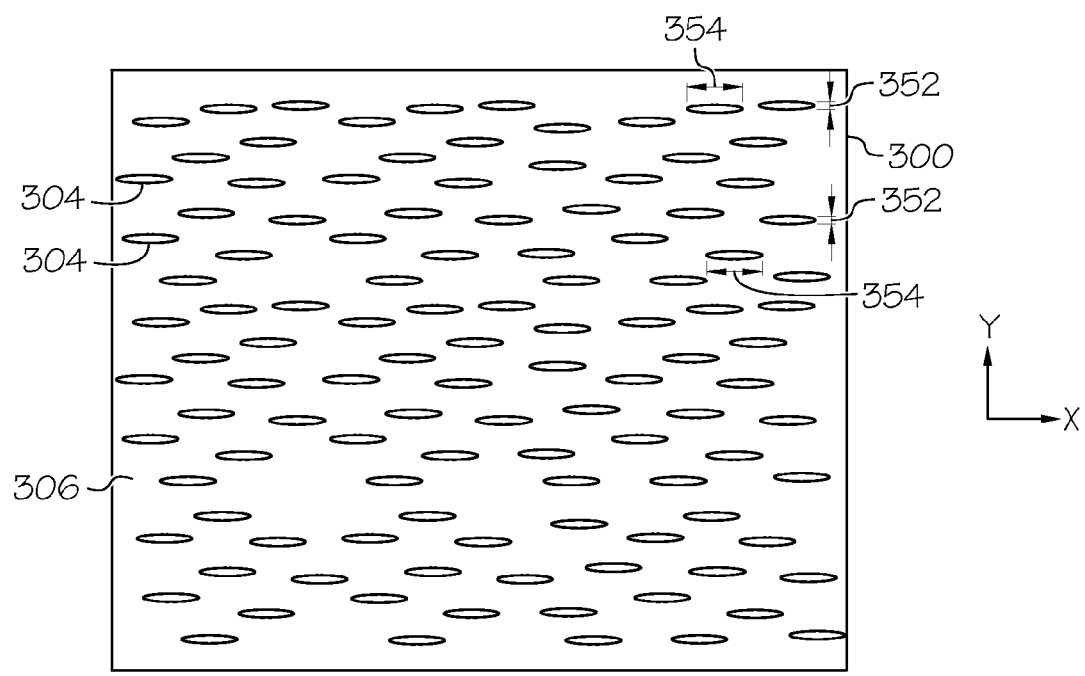
FIG. 2 schematically depicts a cross-sectional top view of a bonding layer, according to one or more embodiments shown and described herein.
Figure 3:
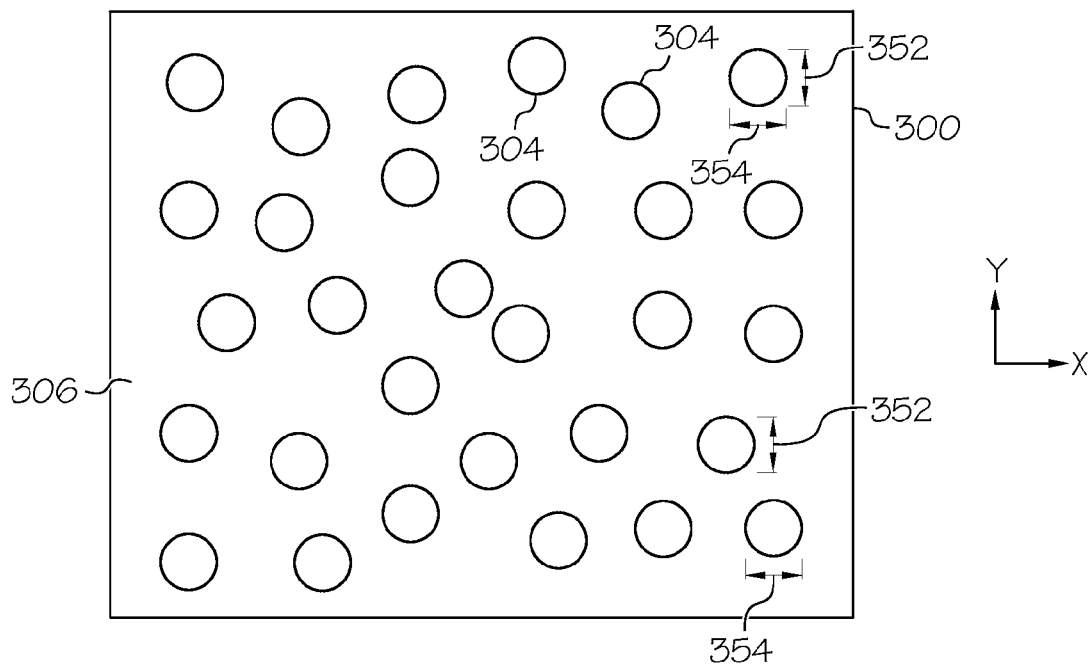
FIG. 3 schematically depicts a cross-sectional top view of a bonding layer, according to one or more embodiments shown and described herein.

Referring to FIGS. 1-3, in one embodiment the length 354 of each stress-reducing additive 304 may be greater than its height 356. For example, the stress-reducing additives 304 may comprise a ratio of length:height of at least about 1.5:1, at least about 2:1, at least about 3:1, at least about 4:1, at least about 5:1, or even at least about 8:1. In embodiments, the stress-reducing additives 304 may comprise a ratio of length: height of from about 1.5:1 to about 20:1, from about 2:1 to about 10:1, or from about 3:1 to about 8:1.

FIG. 2 shows a top view of one embodiment of FIG. 1 where the stress-reducing additives 304 may be substantially oblong shape, such as ellipsoid shaped. For example, the stress-reducing additives 304 may comprise a ratio of length: width of at least about 1.5:1, at least about 2:1, at least about 3:1, at least about 4:1, at least about 5:1, or even at least about 8:1. While the stress-reducing additives 304 of FIG. 2 are aligned (i.e., the lengths of each stress-reducing additive 304 are in substantially the same direction), in some embodiments, the length 354 (the longest dimension in the plane parallel to the lower substrate bonding surface 402) of each stress-reducing additive 304 is not in the same direction, and may be randomly arranged. However, in embodiments, while the direction of the length 354 of the stress-reducing additives 304 may be different, the height 356 of each stress-reducing additive 304 may be greater than its length 354.

FIG. 3 shows a top view of one embodiment of FIG. 1 where the stress-reducing additives 304 may be substantially disk shaped. For example, the stress-reducing additives 304 may comprise a ratio of length:width of from about 2:1 to about 1:2, from about 1.7:1 to about 1:1.7, from about 1.5:1 to about 1:1.5, from about 1.3:1 to about 1:1.3, or about 1:1.

In embodiments, the length 354 of each stress-reducing additive 304 may be at least about 2 microns, at least about 3 microns, at least about 4 microns, at least about 5 microns, at least about 7 microns, at least about 10 microns, at least about 15 microns, or even at least about 20 microns. The length 354 of each stress-reducing additive 304 may be less than or equal to about 100 microns, less than or equal to about 75 microns, less than or equal to about 50 microns, less than or equal to about 25 microns, less than or equal to about 20 microns, less than or equal to about 15 microns, less than or equal to about 10 microns, or even less than or equal to about 5 microns. For example, the length 354 of each stress-reducing additive 304 may be from about 3 microns to about 25 microns, or from about 5 microns to about 10 microns.

Without being bound by theory, it is believed in the embodiment of FIG. 1, where the length 354 of each stress-reducing additive 304 may be greater than its height 356, that bond strength may be enhanced, especially when a shear stress F is applied on the substrates 200, 400.

Figure 4:
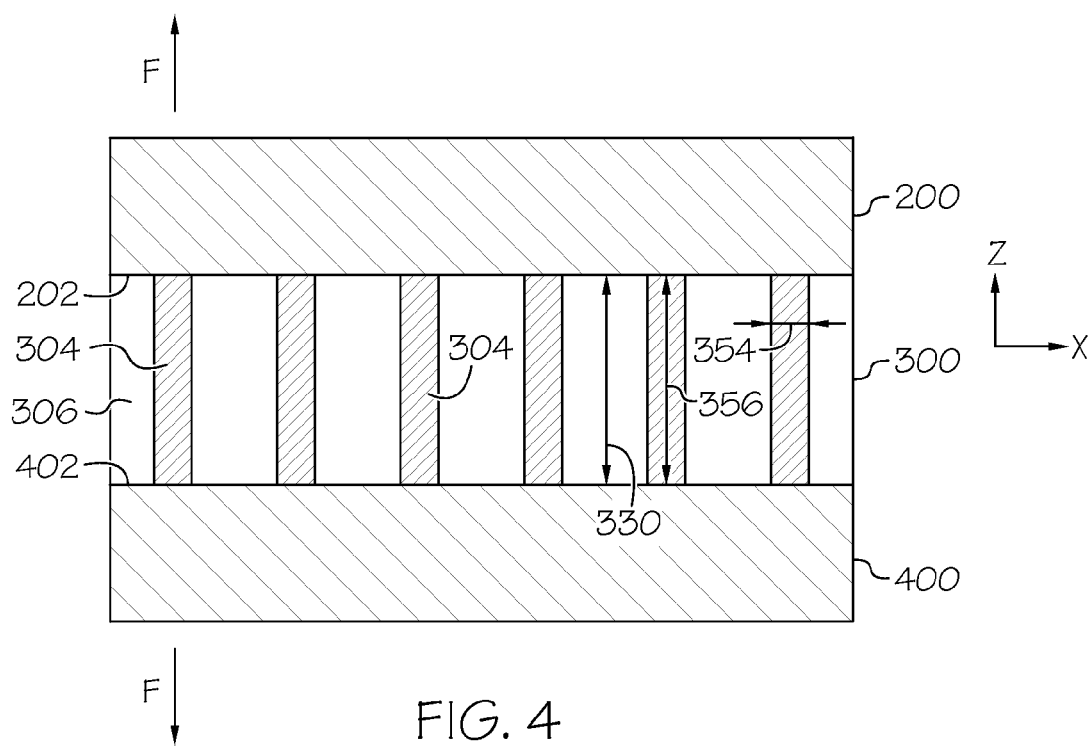
FIG. 4 schematically depicts a cross-sectional side view of two substrates bonded to one another with a bonding layer, according to one or more embodiments shown and described herein.
Figure 5:
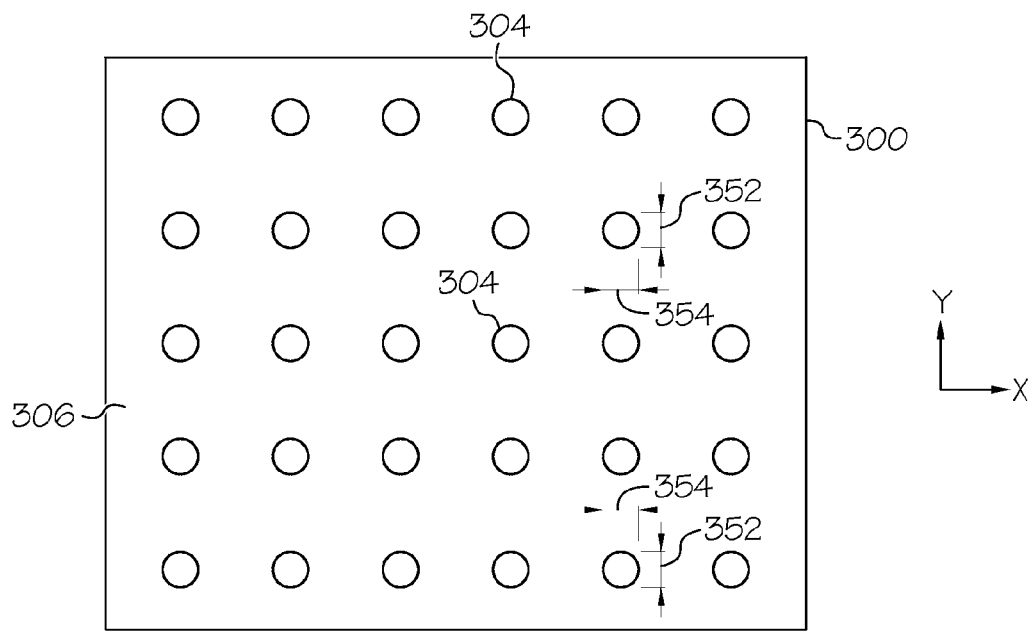
FIG. 5 schematically depicts a cross-sectional top view of a bonding layer, according to one or more embodiments shown and described herein.

Referring to FIGS. 4 and 5, in one embodiment the height 356 of each stress-reducing additive 304 may be greater than its length 354 and it width 352, where FIG. 4 shows a side view and FIG. 5 shows a top view. For example, the stress-reducing additives 304 comprise a ratio of height:length of at least about 10:1 and a ratio of height:width of at least about 10:1. The stress-reducing additives 304 may be rod shaped. In embodiments, the stress-reducing additives 304 may comprise a ratio of height:length of at least about 5:1, at least about 7.5:1, at least about 10:1, at least about 15:1, at least about 20:1, or even at least about 50:1. In embodiments, the stress-reducing additives 304 may comprise a ratio of height:length of from about 5:1 to about 50:1, or from about 10:1 to about 30:1. In embodiments, the stress-reducing additives 304 may comprise a ratio of height:width of at least about 5:1, at least about 7.5:1, at least about 10:1, at least about 15:1, at least about 20:1, or even at least about 50:1. In embodiments, the stress-reducing additives 304 may comprise a ratio of height:width of from about 5:1 to about 50:1, or from about 10:1 to about 30:1.

In one embodiment, as shown in FIG. 4, the height 356 of one or more of the stress-reducing additives 304 may be about equal to the thickness 330 of the composite bonding layer 300. In such an embodiment, a stress-reducing additive 304 may be in contact with the upper substrate bonding surface 202 and the lower substrate bonding surface 402. In other embodiments, the height 356 of one or more of the stress-reducing additives 304 may at least about 25%, at least about 50%, at least about 75%, or at least about 90% of the thickness 330 of the composite bonding layer 300.

Referring now to FIG. 5, the stress-reducing additives 304 may be rod-shaped with substantially circular cross sections. For example, the stress-reducing additives 304 may comprise a ratio of length:width of from about 2:1 to about 1:2, from about 1.7:1 to about 1:1.7, from about 1.5:1 to about 1:1.5, from about 1.3:1 to about 1:1.3, or about 1:1. In other embodiments, rod-shaped stress-reducing additives 304 may have other shapes, such as rectangular prisms, ellipsoid prisms, triangular prisms, etc. The stress-reducing additives 304 may be arranged in uniform columns and rows, as shown in FIG. 5, or may have a random pattern.

Without being bound by theory, it is believed in the embodiment of FIG. 4, where the height 356 of each stress-reducing additive 304 may be greater than its length 354, that bond strength may be enhanced, especially when a tensile stress F is applied on the substrates 200, 400.

Generally, the embodiments described herein may be fabricated by a variety of techniques and materials. In one embodiment, a composite bonding layer precursor is heated to form the composite bonding layer 300 and bond the upper substrate 200 to the lower substrate 400. The composite bonding layer precursor may comprise a plurality of stress-reducing additives 304 in a metal matrix precursor. In one embodiment, the metal matrix precursor may comprise a plurality of metal particles in a binder matrix. The metal particles may be from about 1 micron to about 100 microns in diameter, and may be substantially spherical in shape. The binder may be a polymer binder which burns out of the bonding layer precursor 301 when heated. The metal particles may comprise any metal, including those disclosed herein as included in metal matrix 306. Generally, to form the bonded system 100, the composite bonding layer precursor is positioned between and in contact with the substrates 200, 400, and at least the composite bonding layer precursor is heated to form the composite bonding layer 300. The heating may be to a temperature at least sufficient to melt at least a portion of the material of the metal particles and to burn out the binder.

Figure 6:
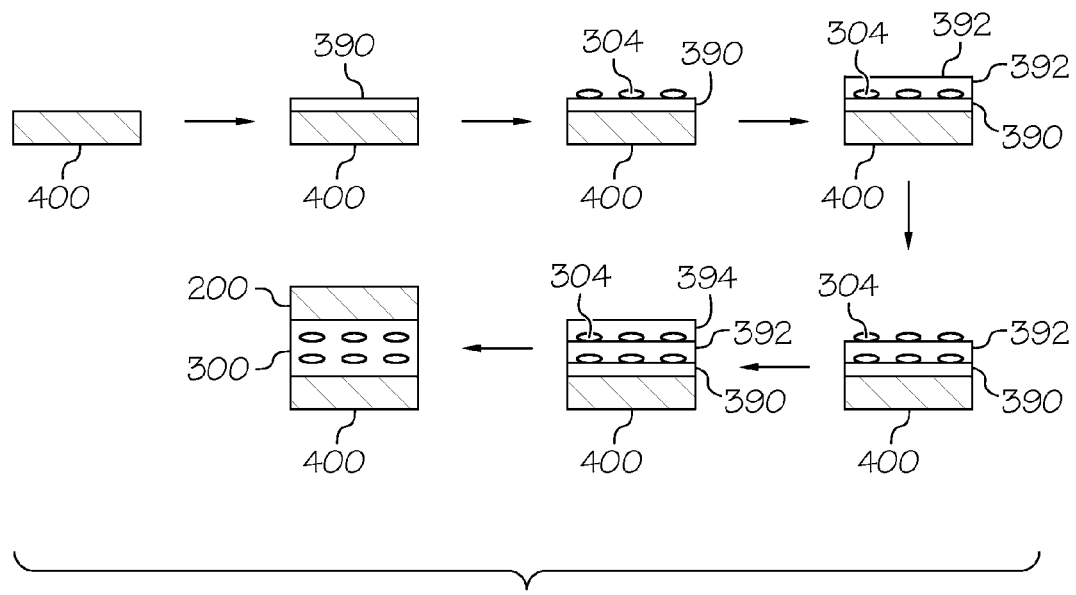
FIG. 6 schematically depicts process steps for the fabrication of a bonding layer, according to one or more embodiments shown and described herein.

Now referring to FIG. 6, one embodiment of a fabrication technique for the embodiment of FIG. 1 is depicted, where the metal matrix precursor is applied in a layered process with stress-reducing additives 304 added between each layer. In one embodiment, a lower substrate 400 is supplied and a metal matrix first layer precursor 390 is applied to the lower substrate. A plurality of stress-reducing additives 304 are applied on the metal matrix first layer precursor 390, and a metal matrix second layer precursor is applied thereon, surrounding the stress-reducing additives 304 with the metal matrix first layer precursor 390 and metal matrix second layer precursor 392. Another plurality of stress-reducing additives 304 are applied on the metal matrix second layer precursor 392, and a metal matrix third layer precursor 394 is applied thereon. This process may be repeated indefinitely, to form many layers of metal matrix precursor and many levels of stress-reducing additives 304. An upper substrate is applied over the layers and, once heated, becomes an upper substrate 200 bound to a lower substrate 400 by a composite bonding layer 300.

In another embodiment, the bonding layer 300 may be prepared prior to deposition onto the lower substrate 400. For example, the bonding layer 300, including stress-reducing additives 304 that are embedded in a metal matrix 306, may be prepared by a process similar to that depicted in FIG. 6. However, the bonding layer 300 need not be limited to such a preparation technique. Following preparation of the bonding layer 300, the bonding layer 300 may be deposited onto and positioned in contact with the lower substrate 400. Thereafter, the upper substrate 200 may be deposited onto and positioned in contact with the bonding layer 300. Further, it should be understood that in such a process, the ordering of steps involving the contacting of the upper substrate 200, lower substrate 400, and bonding layer 300 need not be identical to that provided in the example above. For example, the upper substrate 200 could contact the bonding layer 300 prior to the contacting of the lower substrate 400 with the bonding layer 300, or the bonding layer 300 could even be contacted with the upper substrate 200 and lower substrate 400 simultaneously.

As described herein, additives having a relatively low elastic modulus may be included in a metallic bonding layer to provide for increased durability or strength when stresses are applied. The relative shape and positioning of the additives may further enhance the bond, especially when shear and/or tensile stresses are applied on the substrates. The bond may be suitable for electronics applications and may have good thermal conductivity characteristics.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used herein, the phrase "consisting essentially of" refers to an embodiment that consists of the specified materials and may additionally consist of other materials in amounts that that do not materially affect the basic and novel characteristic(s) of the embodiment. For example, a body that consists essentially of a material may additionally include one or more additional materials in an amount less than about 1 wt % where the additional material does not materially affect the basic characteristics of the system.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A system of bonded substrates, the system comprising:
a first substrate comprising a bonding surface;
a second substrate comprising a complementary bonding surface; and
a composite bonding layer positioned between the first substrate and the second substrate and in contact with the bonding surface of the first substrate and the complementary bonding surface of the second substrate, wherein the composite bonding layer comprises:
a metal matrix; and
a plurality of stress-reducing additives disposed in the metal matrix, each stress-reducing additive comprising a three-dimensional shape comprising a height in a direction substantially perpendicular to the bonding surface of the first substrate, a length in a direction substantially parallel to the bonding surface of the first substrate, and a width in a direction substantially parallel to the bonding surface of the first substrate, wherein the stress-reducing additives comprise a ratio of length:height of at least about 2:1, and an elastic modulus of a material of the stress-reducing additive is less than an elastic modulus of the material of the metal matrix.

2. The system of claim 1, wherein the metal matrix consists essentially of one or more metals chosen from tin, nickel, copper, silver, aluminum, or combinations thereof.

3. The system of claim 1, wherein the elastic modulus of the material of the metal matrix is at least about 50% greater than the elastic modulus of the material of the stress-reducing additives.

4. The system of claim 1, wherein the stress-reducing additives comprises at least about 90 wt % of one or more polymers.

5. The system of claim 1, wherein the material of the stress-reducing additives has an elastic modulus of less than or equal to about 40 GPa.

6. The system of claim 1, wherein the stress-reducing additives are substantially disk shaped or are substantially oblong shaped.

7. The system of claim 1, wherein the stress-reducing additives comprise a ratio of length:width of from about 2:1 to about 1:2.

8. The system of claim 1, wherein the stress-reducing additives comprise a ratio of length:width of at least about 3:1.

9. The system of claim 1, wherein:
the bonding surface of the first substrate is substantially planar;
the complementary bonding surface of the second substrate is substantially planar; and
the bonding surface of the first substrate is substantially parallel to the complementary bonding surface of the second substrate.

10. A system of bonded substrates, the system comprising:
a first substrate comprising a bonding surface;
a second substrate comprising a complementary bonding surface; and
a composite bonding layer positioned between the first substrate and the second substrate and in contact with the bonding surface of the first substrate and the complementary bonding surface of the second substrate, wherein the composite bonding layer comprises:
a metal matrix; and
a plurality of stress-reducing additives disposed in the metal matrix, each stress-reducing additive comprising a three-dimensional shape comprising a height in a direction substantially perpendicular to the bonding surface of the first substrate, a length in a direction substantially parallel to the bonding surface of the first substrate, and a width in a direction substantially parallel to the bonding surface of the first substrate, wherein the stress-reducing additives comprise a ratio of height:length of at least about 5:1 and a ratio of height:width of at least about 5:1, and an elastic modulus of a material of the stress-reducing additive is less than an elastic modulus of the material of the metal matrix.

11. The system of claim 10, wherein the metal matrix consists essentially of one or more metals chosen from tin, nickel, copper, silver, aluminum, or combinations thereof.

12. The system of claim 10, wherein the elastic modulus of the material of the metal matrix is at least about 50% greater, than the elastic modulus of the material of the stress-reducing additives.

13. The system of claim 10, wherein the stress-reducing additives comprises at least about 90 wt % of one or more polymers.

14. The system of claim 10, wherein the material of the stress-reducing additives has an elastic modulus of less than or equal to about 40 GPa.

15. The system of claim 10, wherein the stress-reducing additives are substantially rod shaped.

16. The system of claim 10, wherein the height of the stress-reducing additives is about equal to a thickness of the composite bonding layer.

17. The system of claim 10, wherein the stress-reducing additives comprise a ratio of height:length of at least about 10:1 and a ratio of height:width of at least about 10:1.

18. The system of claim 10, wherein:
the bonding surface of the first substrate is substantially planar;
the complementary bonding surface of the second substrate is substantially planar; and
the bonding surface of the first substrate is substantially parallel to the complementary bonding surface of the second substrate.

19. A composite bonding layer positioned between a first substrate and a second substrate, the composite bonding layer comprising:
a metal matrix; and
a plurality of stress-reducing additives disposed in the metal matrix, each stress-reducing additive comprising a three-dimensional shape comprising a height in a direction substantially perpendicular to the bonding surface of the first substrate, a length in a direction substantially parallel to the bonding surface of the first substrate, and a width in a direction substantially parallel to the bonding surface of the first substrate, wherein the stress-reducing additives comprise a ratio of length:height of at least about 2:1, and an elastic modulus of a material of the stress-reducing additive is less than an elastic modulus of the material of the metal matrix.

20. The system of claim 19, wherein the metal matrix consists essentially of one or more metals chosen from tin, nickel, copper, silver, aluminum, or combinations thereof.

\* \* \* \* \*